(12) United States Patent
Ravikumar et al.

(10) Patent No.: US 11,143,700 B2
(45) Date of Patent: Oct. 12, 2021

(54) ANALYSIS OF ELECTRO-OPTIC WAVEFORMS

(71) Applicant: Advanced Micro Devices, Inc., Santa Clara, CA (US)

(72) Inventors: Venkat Krishnan Ravikumar, Singapore (SG); Nathan Linarto, Singapore (SG); Wen Tsann Lua, Singapore (SG); Abel Tan Yew Hong, Singapore (SG); Shei Lay Phoa, Singapore (SG); Gopinath Ranganathan, Singapore (SG); Jiann Minn Chin, Singapore (SG)

(73) Assignee: Advanced Micro Devices, Inc., Santa Clara, CA (US)

( * ) Notice: Subject to any disclaimer, the term of this patent is extended or adjusted under 35 U.S.C. 154(b) by 203 days.

(21) Appl. No.: 16/582,758

(22) Filed: Sep. 25, 2019

(65) Prior Publication Data

US 2021/0088582 A1 Mar. 25, 2021

(51) Int. Cl.
*G01R 31/28* (2006.01)
*G01R 31/265* (2006.01)
(Continued)

(52) U.S. Cl.
CPC ......... *G01R 31/2889* (2013.01); *G01R 23/17* (2013.01); *G01R 29/0885* (2013.01)

(58) Field of Classification Search
CPC .... G01R 31/28; G01R 31/265; G01R 31/311; G01R 31/01; G01R 31/3177; G01R 23/17; G01R 29/08
See application file for complete search history.

(56) References Cited

U.S. PATENT DOCUMENTS

| 6,072,179 A | 6/2000 | Paniccia et al. |
| 9,651,610 B2 | 5/2017 | Eiles et al. |

(Continued)

OTHER PUBLICATIONS

Venkat Krishnan Ravikumar, Winson Lua, Seah Yi Xuan, Gopinath Ranganathan and Angeline Phoa; "Combinational Logic Analysis using Laser Voltage Probing"; White paper; ISTFA 2015; 41st International Symposium for Testing and Failure Analysis; Nov. 1-5, 2015; Portland, OR; United States; 7 pages.

(Continued)

*Primary Examiner* — Neel D Shah
(74) *Attorney, Agent, or Firm* — Polansky & Associates, P.L.L.C.; Paul J. Polansky; Nathan H. Calvert

(57) ABSTRACT

An optic probe is used to measure signals from a device under test. The optic probe is positioned at a target probe location within a cell of the device under test, the cell including a target net to be measured and a plurality of non-target nets. A test pattern is applied to the cell with the optic probe a laser probe (LP) waveform is obtained in response. A target net waveform is extracted from the LP waveform by: (i) simulating a combinational logic analysis (CLA) cross-talk waveform to model cross-talk from selected non-target nets by simulating an optical response of the cell to the test pattern with the target net masked; (ii) estimating a cross-talk weight; and (iii) determining a target net waveform by weighting the CLA cross-talk waveform according to the cross-talk weight and subtracting the weighted CLA cross-talk waveform from the LP waveform.

20 Claims, 14 Drawing Sheets

(51) Int. Cl.
  *G01R 31/311*  (2006.01)
  *G01R 31/01*   (2020.01)
  *G01R 23/17*   (2006.01)
  *G01R 29/08*   (2006.01)

(56) References Cited

U.S. PATENT DOCUMENTS 10,012,692 B2    7/2018  Ross et al.
2014/0149811 A1*  5/2014  Ross ................. G01R 31/2882
                                                    714/724

OTHER PUBLICATIONS

Eli Abuayob, Evgny Nisenboim, Amir Revah, Baohua Niu and Tom Tong; "Complex Waveform Analysis for Advanced CMOS ICs: Physics of Complex Waveform Signals for Design Validation and Debug Application"; ISTFA 2016; 42nd International Symposium for Testing and Failure Analysis; Nov. 6-10, 2016; Fort Worth, TX; United States; 8 pages.

V.K. Ravikumar, G. Lim, J.M. Chin, K.L. Pey, J.K.W. Yang; "Understanding spatial resolution of laser voltage imaging"; Microelectronics Reliability, 88-90; Elsievier Publication; 2018; pp. 255-261; 7 pages.

Venkat Krishnan Ravikumar, et al.; "Pattern search automation for combinational logic analysis"; Conference Proceedings from the 44th International Symposium for Testing and Failure Analysis; ISTFA 2018; Oct. 28-Nov. 1, 2018; Phoenix, AZ; United States; pp. 86-92; 7 pages.

* cited by examiner

| A1 | A2 | A3 | Cycle# | Segment# | (Raw-CLA) |
|---|---|---|---|---|---|
| 0 | 1 | 1 | 28 | 3 | 0.07 |
| 0 | 1 | 1 | 29 | 3 | 0.09 |
| 0 | 0 | 1 | 30 | 1 | -0.06 |
| 0 | 1 | 1 | 31 | 3 | 0.08 |
| 0 | 1 | 1 | 32 | 3 | -0.02 |
| 0 | 1 | 1 | 33 | 3 | 0.05 |
| 0 | 0 | 1 | 34 | 1 | -0.07 |
| 0 | 1 | 1 | 35 | 3 | 0.09 |
| 0 | 0 | 1 | 36 | 1 | -0.07 |
| 0 | 1 | 1 | 37 | 3 | 0.07 |
| 1 | 1 | 1 | 38 | 7 | -0.71 |
| 0 | 0 | 1 | 39 | 1 | -0.10 |

FIG. 11

ANALYSIS OF ELECTRO-OPTIC WAVEFORMS

CROSS-REFERENCE TO RELATED APPLICATIONS

This application is related to U.S. patent application Ser. No. 16/296,614, filed Mar. 8, 2019, entitled "Probe Placement For Laser Probing System", which is hereby incorporated by reference.

BACKGROUND

Integrated circuits experience circuit failures from a variety of causes. For example, problems in the manufacturing process can result in defects that prevent the circuit from operating properly. Integrated circuits are tested at the manufacturing facility for proper operation before being shipped to customers. However, the integrated circuits can have defects that are not found during manufacturing test due to the inability to test every circuit node in the integrated circuit. Also, the integrated circuit can operate properly at the factory but subsequently fail when placed in a larger product that is sold to an end user. The subsequent failures can be caused by circuit degradation over time, mechanical stresses leading to cracks and voids, and chemical contamination from mobile ions. When a failure occurs, whether due to the manufacturing process, design, reliability, or incorrect usage of the integrated circuit, there is a need to isolate the failure and determine the source of the failure in order to take corrective action.

Integrated circuit engineers typically determine the operation in which the failure occurs and then identify the circuit element that caused the failure. A test program can typically be used to identify the operation. However, isolating the actual failing circuit is much more difficult. Historically, engineers removed passivation covering the chip and placed tiny needles, and subsequently electron beams, on exposed metal to capture signals and compare the captured signals to expected results. However, with the advent of flip-chip technology and as integrated circuit manufacturing technology progressed, circuit features became too small for mechanical probes, leading engineers to adopt laser probing.

With laser probing, also known as optic probing or electro-optic probing, a laser source is focused at a single node of an integrated circuit, and the characteristics of the reflected laser light indicate changes in the voltage of the node over time. Typical laser probing uses visible light or infrared radiation, and the chip is probed from the backside, i.e. the non-active surface. This technique has allowed probing resolution down to about 200 nanometers (nm). However as minimum transistor geometries have shrunk to much smaller sizes such as 16 nm and 14 nm, it has become difficult to discern the operation of a single transistor using laser probing, especially in the vicinity of other active transistors.

One known technique to solve these problems is to probe the integrated circuit die from the backside using shorter wavelength light, such as light in the visible spectrum despite silicon being highly absorptive in the visible spectrum. Though it achieves better resolution, this technique creates other problems. First, it requires the integrated circuit die to be thinned down to below 5 microns ($\mu$m) to overcome the losses in signal via absorption in the substrate, making it difficult to analyze failures. This process adds risk of damage caused by thinning the die, and affects the thermal dissipation in the active circuits. Second, because of the reduced wavelength, the light itself can change the behavior of the circuit. Thus, this technique has proved to be inadequate.

BRIEF DESCRIPTION OF THE DRAWINGS

FIG. 11 shows a table of partial analytical results from a segmentation analysis like that of FIG. 10;

Figure 1:
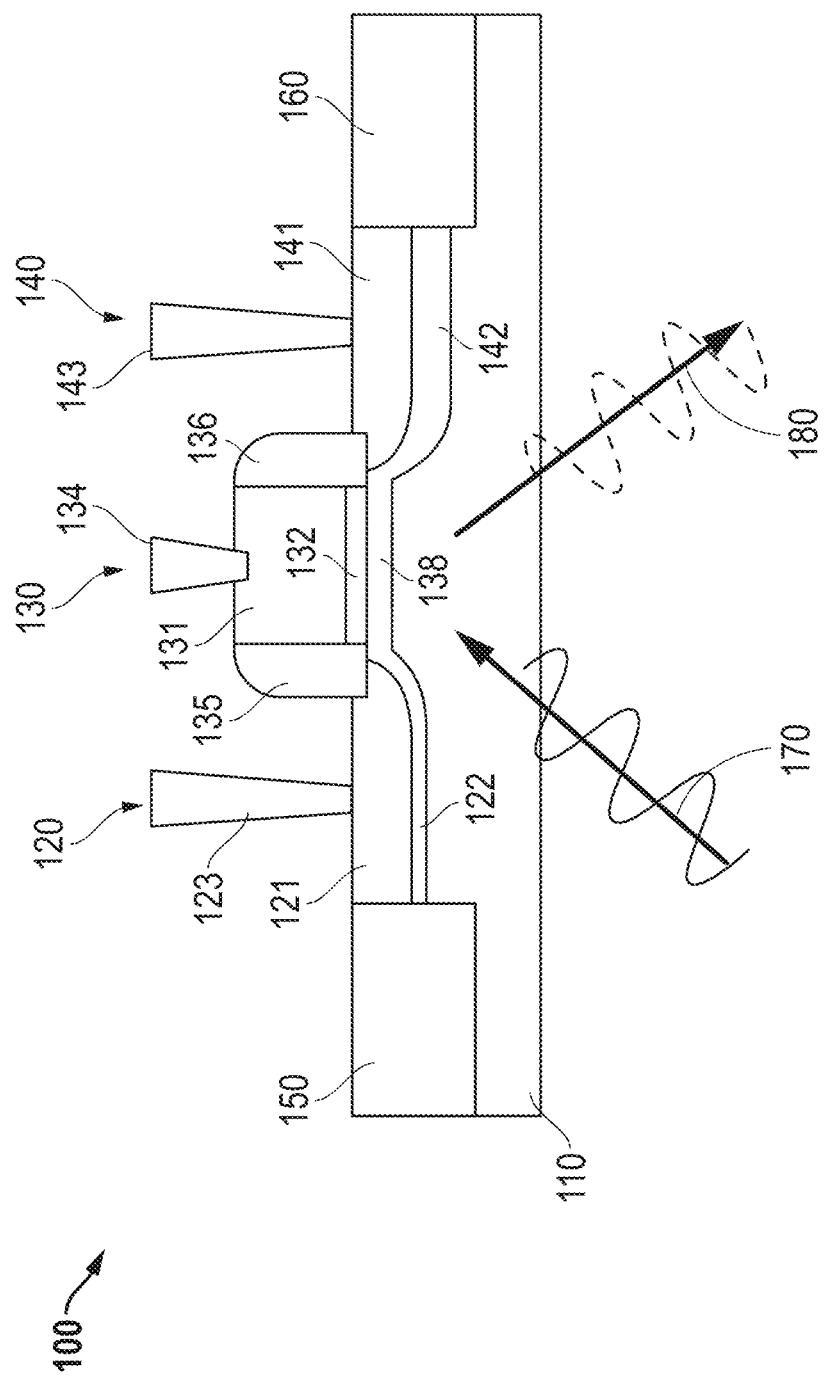
FIG. 1 illustrates a cross section of an integrated circuit being probed using a technique known in the prior art.

In the following description, the use of the same reference numbers in different drawings indicates similar or identical items. Unless otherwise noted, the word "coupled" and its associated verb forms include both direct connection and indirect electrical connection by means known in the art, and unless otherwise noted any description of direct connection implies alternate embodiments using suitable forms of indirect electrical connection as well. Also, various components are referred to as "optics" or "optical", but it is to be understood that these names do not imply that the electromagnetic signals are necessarily within the visible range.

DETAILED DESCRIPTION OF ILLUSTRATIVE EMBODIMENTS

A method uses an optic probe to measure signals from a device under test. The method includes positioning an optic probe at a target probe location within a cell of the device under test, the cell including a target net to be measured and a plurality of non-target nets. A test pattern is applied to the cell with the optic probe at the target probe location and a laser probe (LP) waveform is obtained in response. A target net waveform is extracted from the LP waveform by: (i) simulating a combinational logic analysis (CLA) cross-talk waveform to model cross-talk from selected non-target nets by simulating an optical response of the cell to the test pattern at the target probe location with the target net masked; (ii) estimating a cross-talk weight; and (iii) determining a target net waveform by weighting the CLA cross-talk waveform according to the cross-talk weight and subtracting the weighted CLA cross-talk waveform from the LP waveform.

A laser probing system for laser probing a device under test includes a laser source, an optical system, a receiver circuit, a combinational logic analysis (CLA) processor, and a test controller. The optical system provides an optic probe at selectable locations of the device under test in response to light from the laser source, receives reflected light from the device under test, and outputs the reflected light. The receiver circuit receives the reflected light from the optical system, and provides a laser probe (LP) waveform in response to the reflected light. The CLA processor simulates an optical response to a test pattern at a target location of the cell of the device under test and forms a CLA waveform in response. The test controller has a first input for receiving the CLA waveform, a second input for receiving the LP waveform, and an output for providing a control signal. The test controller applies the test pattern to the device under test, triggers the receiver circuit to capture the LP waveform, and causes a target net waveform to be extracted from the LP waveform by: (i) simulating a CLA cross-talk waveform to model cross-talk from selected non-target nets by simulating an optical response of the cell to the test pattern at the target location with the target net masked; (ii) estimating a cross-talk weight; and (iii) determining the target net waveform by weighting the CLA cross-talk waveform according to the cross-talk weight and subtracting the weighted CLA cross-talk waveform from the LP waveform.

An analysis system for a laser probing system includes a receiver circuit, a combinational logic analysis (CLA) processor, and a test controller. The receiver circuit has an input for receiving reflected light produced from an optic probe, a control input for receiving a control signal, and an output for providing a laser probe (LP) waveform of the reflected light in response to an activation of the control signal. The CLA processor has an output for providing a CLA waveform in response to simulating an optical response to a test pattern at a target location on a surface of a cell of a device under test. The test controller has a first input for receiving the CLA waveform, a second input for receiving the LP waveform, a first output for providing the control signal, a second output for providing the test pattern. The test controller applies the test pattern to the device under test, triggers the receiver circuit to capture the LP waveform, and causes a target net waveform to be extracted from the LP waveform by: (i) simulating a CLA cross-talk waveform to model cross-talk from selected non-target nets by simulating an optical response of the cell to the test pattern at the target location with the target net masked; (ii) estimating a cross-talk weight; and (iii) determining the target net waveform by weighting the CLA cross-talk waveform according to the cross-talk weight and subtracting the weighted CLA cross-talk waveform from the LP waveform.

FIG. 1 illustrates a cross section of an integrated circuit 100 being probed using a technique known in the prior art.

As shown in FIG. 1, integrated circuit 100 has a front side containing an active surface oriented on the top and a back side oriented on the bottom. Integrated circuit 100 is formed with a lightly-doped p-type ("p−") substrate 110. The cross section in FIG. 1 shows a portion of integrated circuit 100 having a metal-oxide-semiconductor (MOS) transistor formed with a source portion 120, a gate portion 130, and a drain portion 140. Source portion 120 has a heavily-doped n-type ("n+") diffusion 121 forming the source of the transistor, a free carrier region 122 underlying n+ source region 121, and a metal via 123 that extends upward to a conductor forming a more negative power supply voltage terminal labeled "Vss" (not shown in FIG. 2). Gate portion 130 includes a gate 131, a gate dielectric 132, a free carrier region 133, a via 134 that extends upward to a signal conductor (not shown in FIG. 2) that conducts a voltage labeled "+VG", and sidewall portions 135 and 136. Drain portion 140 has an n+ drain diffusion 141 forming the drain of the transistor, a free carrier region 142 underlying n+ drain diffusion 141, and a via 143 to a signal conductor (not shown in FIG. 1) conducting a signal labeled "+VD". Integrated circuit 100 also includes oxide regions 150 and 160 at left and right ends of the transistor. Oxide regions 150 and 160 are high resistance dielectric regions that isolate the source and drain regions of the transistor from surrounding circuitry. FIG. 1 shows oxide regions 150 and 150 as regions formed in substrate 110 such as would be formed by shallow trench isolation (STI), but it should be apparent that the transistor has been formed by just one possible device structure, the n-channel MOS transistor, and other device structures such as a P-channel MOS transistor, a silicon-on-insulator (SOI) transistor, a fin field-effect transistor (FINFET), and the like as well as future-developed transistor technologies can be analyzed using laser probing as well.

When it is desired to probe the transistor, a laser probing system (not shown in FIG. 1) provides an incident beam of light 170 through the back side of integrated circuit 100 to free carrier region 133 below gate portion 130. As the transistor becomes conductive and non-conductive, the size of free carrier region 133 increases and decreases, amplitude modulating the reflected beam 180. The laser probing system includes a receiver circuit that measures the amplitude of the reflected laser light to determine whether the transistor is conductive at a desired point in time. Moreover the measurement can occur repeatedly to form a histogram by which the laser probing system can reconstruct the electrical signal over a time period of interest.

Figure 2:
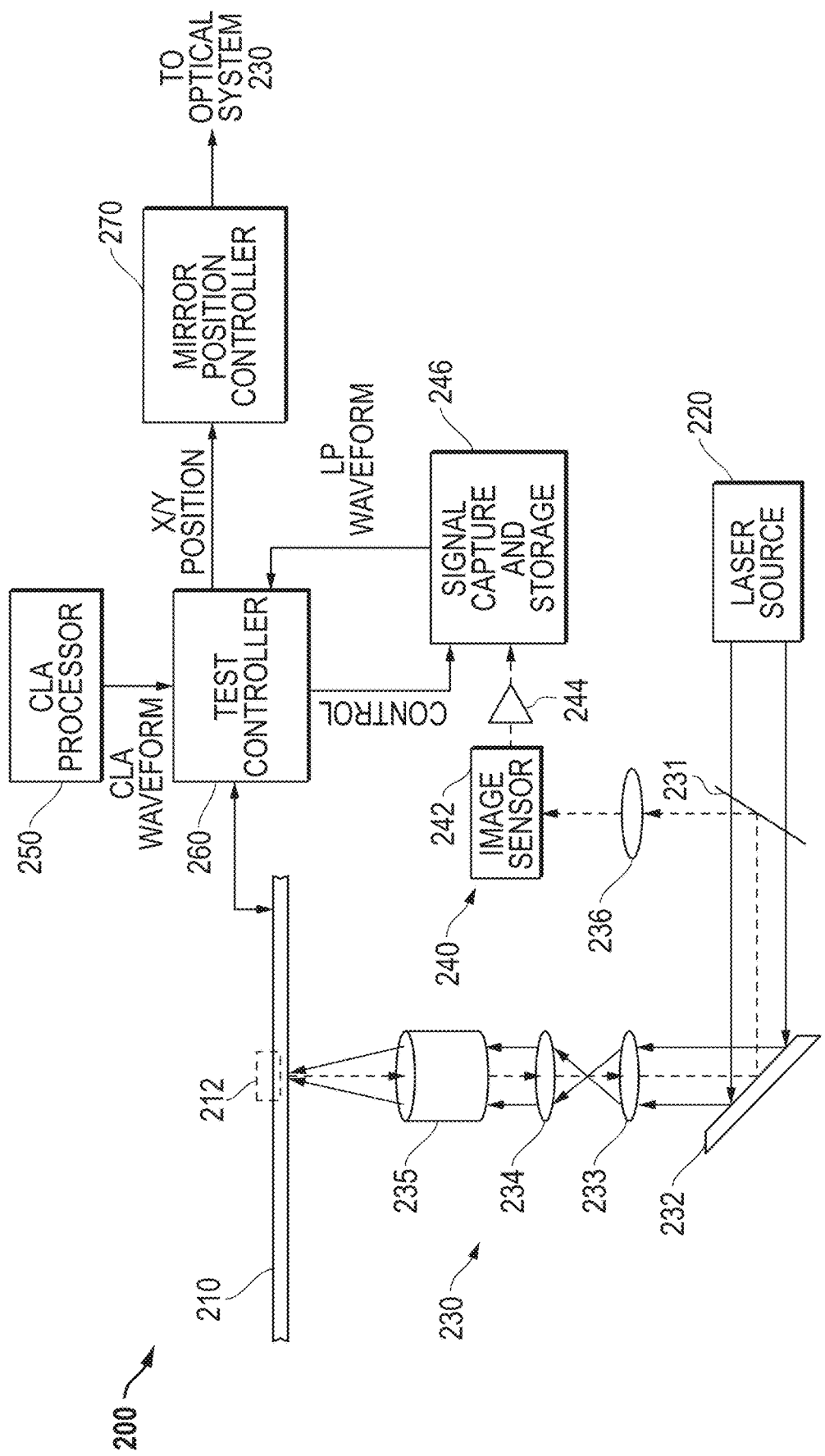
FIG. 2 illustrates in block diagram form a laser probing system according to some embodiments.

FIG. 2 illustrates in block diagram form a laser probing system 200 according to some embodiments. Laser probing system 200 includes generally a device under test 210, a laser source 220, an optical system 230, a receiver circuit 240, a combinational logic analysis (CLA) processor 250, a test controller 260, and a mirror position controller 270.

Device under test 210 is an integrated circuit that, as shown in FIG. 2, has a front side oriented upward and a back side oriented downward. Device under test 210 also has a cell 212 to be laser probed using a test program applied to input terminals.

Laser source 220 emits an incident beam of coherent laser light at a predetermined frequency. In some embodiments, the incident beam could have a wavelength (λ) in the infrared region. In particular, the incident beam could have a wavelength in the near-infrared region such as λ=1064 nm, =1122 nm, =1154 nm, or λ=1319 nm. In one particular embodiment, the incident beam has a wavelength with a wavelength much closer to the visible range, with λ=785 nm. In some embodiments, the optic probe has a size on a surface of the device under test of 100 nm-300 nm. In other implementations, laser sources such as laser diodes or non-coherent laser sources, are used.

Optical system 230 includes a beam splitter 231, an X/Y scan mirror 232, a scan lens 233, a tube lens 234, an objective lens 235, and a focus lens 236. Beam splitter 231 has a left surface and a right surface as oriented in FIG. 2. The left surface receives light emitted by laser source 220 and passes the light through beam splitter 231 substantially uninterrupted. The right surface receives light and reflects it upward. X/Y scan mirror 232 reflects light and is controllable to move the position of the emitted and returned light to and from the back side of device under test 210. Scan lens 233, tube lens 234, and objective lens 235 further condition the incident laser light on the back side of device under test 210 that has been steered to the desired position by controlling X/Y scan mirror 232. The incident radiation interacts with circuitry in cell 212 and forms a reflected beam according to the electrical state of cell 212. The reflected light passes through objective lens 235, tube lens 234, and scan lens 233, and is directed by X/Y scan mirror 232 and beam splitter 231 through focus lens 236 to receiver circuit 240 for detection.

Receiver circuit 240 includes an image sensor 242, a buffer 244, and a signal capture and storage block 246. Image sensor receives the incident radiation from focus lens 236, and provides an electrical signal in response. Buffer 244 re-drives the electrical signal to prevent distortion of the output of image sensor 242. Signal capture and storage block 246 has a first input connected to the output of buffer 244, a second input for receiving a control signal labeled "CONTROL", and an output for providing a signal labeled "LP WAVEFORM". In this way, receiver circuit 240 converts the reflected light from optical system 230 to electrical signal LP WAVEFORM.

CLA processor 250 has an output for providing a signal labeled "CLA WAVEFORM". CLA processor 250 forms the CLA WAVEFORM by simulating an optical response at a target location on a surface of cell 212 of device under test 210 to the application of the test pattern. As used herein, a "test pattern" generally means a set of electrical stimuli applied to a device under test. For example, in one implementation the test pattern is an indefinite loop of a set of test vectors within an automated test equipment (ATE) test pattern that causes the device under test to exhibit the desired behavior. The CLA WAVEFORM includes, for example, high and low voltages based on logic states but also interactions between the circuitry in cell 212 and adjacent circuitry, known generally as electroscopic cross-talk or simply "cross-talk".

Test controller 260 has a first input for receiving the CLA WAVEFORM, a second input for receiving the LP WAVEFORM, a first output for providing the CONTROL signal, a second output connected to device under test 210 for providing the test pattern and receiving output signals provided by device under test 210 in response to the test pattern, and a third output for providing a position signal labeled "X/Y POSITION".

Mirror position controller 270 has an input connected to the third output of test controller 260 for receiving the X/Y POSITION signal, and an output connected to optical system 230. For example, the output provided to optical system 230 could be voltages that change to position of X/Y scan mirror 232 to adjust the focused incident beam to another location relative to cell 212, or to another location in device under test 210, indicated by the X/Y POSITION, In operation, optical system 230 receives the incident radiation emitted by laser source 220, focuses it on a back side of device under test 210, and receives reflected radiation that is altered by the interaction of the incident radiation and active nodes in cell 212. Image sensor 242 is a photosensor array that receives the reflected light and provides an electrical signal in response. In general, the electrical signal is proportional to the amount of reflected radiation received at pixels in image sensor 242. Signal capture and storage block 246 forms a histogram of waveform intensities over a period of time initiated by the CONTROL signal. Test controller 260 provide the CONTROL signal at a selected point in the execution of the test pattern. For example, if device under test 210 is a data processor, then test controller 260 runs a test pattern to determine that the failure occurs during the execution of a certain instruction executed.

While test controller 260 provides the test pattern and compares the test pattern to an expected response, CLA processor 250 simulates the optical pattern expected from a properly operating device under test in response to the application of the incident laser light to the back side of it.

One of the problems with the extremely small geometries is that the LP waveform often includes a lot of cross-talk signals from other nets in the vicinity of the target net. Test controller 260 operates to extract a target net waveform from the LP waveform. To do so, test controller 260 directs CLA processor 250 to produce a CLA cross-talk waveform to model cross-talk from selected non-target nets by simulating an optical response of the cell to the test pattern at the target probe location with the target net masked. Then test controller 260 estimates a cross-talk weight to properly scale the cross-talk waveform with respect to the LP waveform. It then produces a target net waveform by weighting the CLA cross-talk waveform according to the cross-talk weight and subtracting the weighted CLA cross-talk waveform from the LP waveform.

The operation of laser probing system 200 according to the technique described above will be further developed by reference to specific examples.

Figure 3:
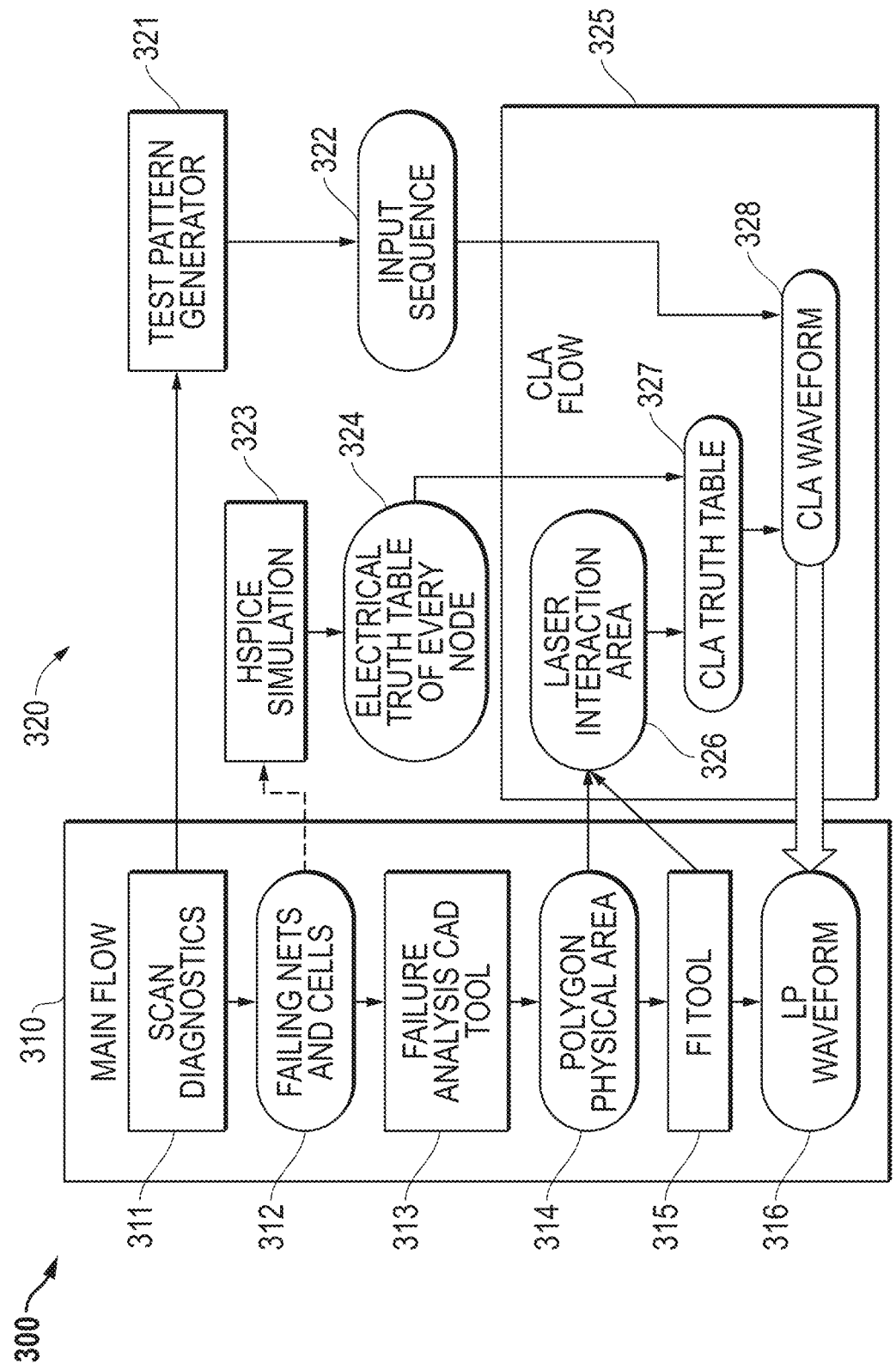
FIG. 3 illustrates in block diagram form a laser voltage probing software ecosystem that can be used to implement the laser probing system of FIG. 2 according to some embodiments.

FIG. 3 illustrates in block diagram form a laser probing (LP) software ecosystem 300 that can be used to implement the laser probing system of FIG. 2 according to some embodiments. LP software ecosystem 300 includes an LP main flow 310 and a CLA flow 320. LP main flow 310 includes a scan diagnostics block 311 that can be used to identify a set of potentially failing circuit networks (nets) and cells 312. Scan diagnostics block 311 uses the failing vector information to narrow down the location of the failure, typically to a few nets and/or cells. Next, a failure analysis computer aided design (CAD) tool 313 is used to define the geometrical shapes of the features corresponding to the failing nets and/or cells. One example of such a tool is the failure analysis tool licensed under the trademarks "Camelot" or "Avalon" by Synopsys, Inc. of Mountain View, Calif. Then an FI tool 315 is used to generate an LP WAVEFORMs 316.

CLA flow 320 includes a test pattern generator 321 that uses the results from scan diagnostics block 311 to generate in input sequence 322, i.e. a test pattern, that generates all possible logic state combinations. An Simulation Program with Integrated Circuit Emphasis (SPICE) simulation block 323, such as HSPICE by Synopsis, simulates the electrical performance of the failing cells identified by scan diagnostics block 311 to generate an electrical truth table 324 of every node of interest. A CLA simulator 325 is a mathematical simulator that uses these inputs as well as the polygon physical area 314 to form the CLA WAVEFORM. One example of a tool that can be used for CLA simulator 325 is the math simulator program licensed under the trademark "MATLAB" licensed by MathWorks of Natick, Mass. CLA simulator 325 combines laser interaction area 326 with electrical truth table 324 to form a CLA truth table 327. CLA simulator 325 uses CLA truth table 327 and input sequence 322 to form the CLA WAVEFORM. In some embodiments, to properly position the optic probe, test controller 260 updates the position signal to move the optic probe closer to the target location according to a degree of fit between the LP waveform and the CLA waveform.

Figure 4:
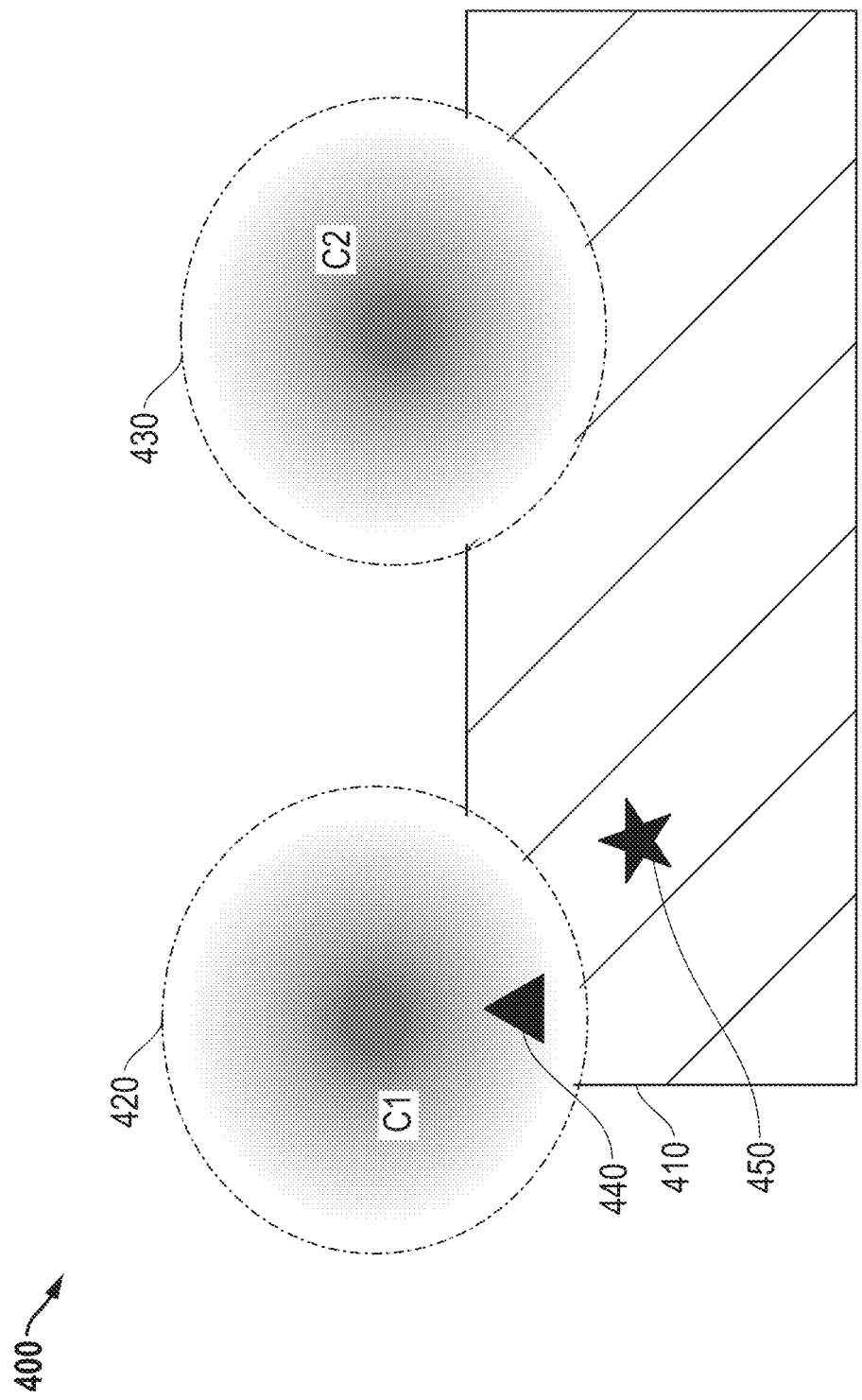
FIG. 4 illustrates in diagram form a backside view of a portion of an integrated circuit showing the effect of cross-talking devices.

FIG. 4 illustrates a backside view of a portion of an integrated circuit 400 with cross-talking devices that illustrates a laser probing placement technique for use with the laser probing system of FIG. 2 according to some embodiments. Integrated circuit 400 includes a cell of interest 410 and two cross-talking devices C1 and C2, in which C1 produces significant cross-talk in area 420 and C2 produces significant cross-talk in area 430. The area of cell includes 410 shows two potential probe points 440 and 450. If probing occurs at probe point 440, then cross-talking device C1 affects the measured LP waveform because probe point 440 is in area 420. If probing occurs at probe point 450, however, then cross-talking devices C1 and C2 do not significantly affect the measured LP waveform because probe point 450 is neither in area 420 or area 430.

CLA processor 250 (FIG. 2) can include cross-talk devices C1 and C2 in the simulation of cell 410. CLA processor 250 can generate the CLA waveforms taking into account the effects of the cross-talking devices and predict the net signal. Test controller 260 can then determine the probe position using the simulation of the LP signal in the presence of the cross-talking devices. The area of cell 410 is such that that in 14 nm technology, the laser probe, even if properly positioned, measures the activity of many surrounding multiple transistors. For example, with 14 nm technology, the contacted poly pitch (CPP) of a transistor is about 78 nm, and the laser probe captures the activity of around 6-9 transistors. Moreover, for an integrated circuit manufactured with even smaller 7 nm technology, the CPP drops to about 55 nm. Thus, as transistor size decreases, extracting a target net signal from cross-talk signals becomes even more important.

Figure 5:
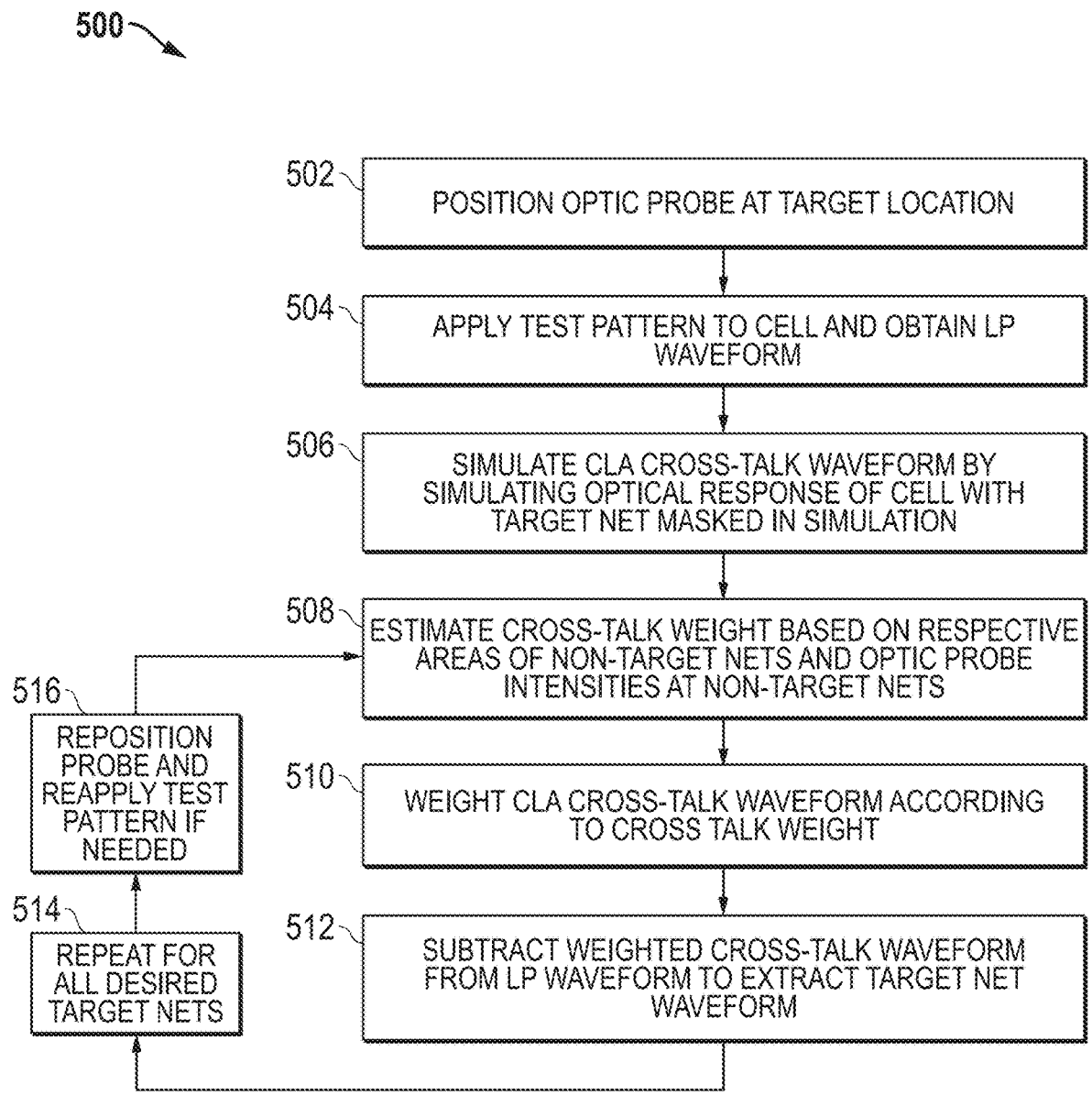
FIG. 5 shows a flow diagram of a laser probe measurement process for use with the laser probing system of FIG. 2 according to some embodiments.

FIG. 5 shows a flow diagram 500 of a laser probe measurement process for use with the laser probing system of FIG. 2 according to some embodiments. Flow diagram 500 starts with block 502, which positions the optic probe at a target location, typically directed at a target net within a particular selected cell of the device under test. At block 504, a test pattern is applied to the cell with the optic probe at the target probe location, and a laser probe (LP) waveform is obtained in response to the target pattern. In some scenarios, the LP waveform includes cross-talk resulting from non-target nets that fall within the area of the optic probe, as discussed above.

The method extracts the target net waveform from the LP waveform to obtain an accurate measurement of the target net. To perform such extraction, at block 506, the process simulates a CLA cross-talk waveform to model cross-talk from selected non-target nets by simulating an optical response of the cell to the test pattern at the target probe location with the target net masked. At block 508, a cross-talk weight is estimated to properly scale the cross-talk waveform with respect to the LP waveform. The cross-talk weight may be estimated by any suitable manner. In some embodiments, clustering is used to identify discrete levels in the final target net waveform through a sweep of cross-talk weight values, with a cross-talk weight value selected based on producing an expected clustering. In other embodiments, the cross-talk weight is estimated based at least on respective areas of the selected non-target nets and respective optic probe intensities at the selected non-target nets.

At block 510, the cross-talk weight is applied to the CLA cross-talk waveform, typically by multiplication. Then at block 512, the process determines the target net waveform subtracting the weighted CLA cross-talk waveform from the LP waveform.

Figure 6:
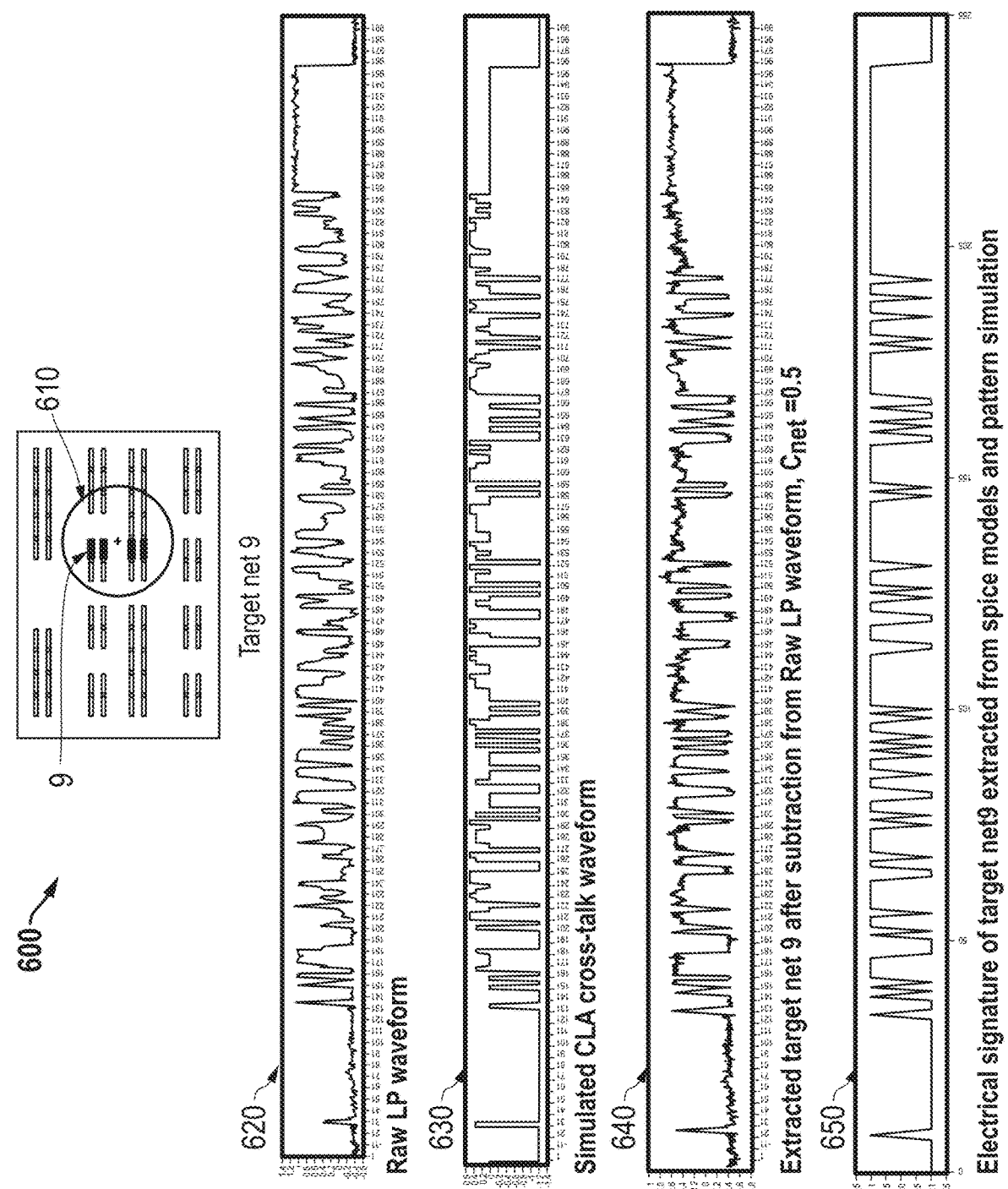
FIG. 6 illustrates a backside view of a portion of an integrated circuit that will be laser probed according to some embodiments, along with four waveforms exemplifying the laser probe analysis process of FIG. 5.

FIG. 6 illustrates a backside view of a portion of an integrated circuit 600 that will be laser probed according to some embodiments, along with four waveforms exemplifying the laser probe analysis process of FIG. 5. A target net, the electrical network currently desired to measured, labelled target net 9 is shown within a laser probe area 610. Other nets that are not currently desired to be measured are referred to as non-target nets. Target net 9 is shown masked over to indicate the analytical masking performed when simulating the CLA cross-talk waveform at block 506 (FIG. 5). A raw LP waveform 620 is obtained from applying the test pattern with the laser probe at laser probe area 610. Raw LP waveform 620 includes signal measurements from target net 9 and cross-talk signal measurements from surrounding non-target nets. A simulated CLA cross-talk waveform 630 is produced by simulating the optical response of the cell to the test pattern at the laser probe area 610, with target net 9 masked as depicted.

An extracted target net LP waveform 640 is shown, produced by subtracting a weighted version of simulated CLA cross-talk waveform 630 from raw LP waveform 620. The quantity $C_{net}$ is the cross-talk weighted used to weight simulated CLA cross-talk waveform 630. Each non-target net produces a different cross-talk signal depending on strength of optic probe along the non-target net and the area of the non-target net. In this example, the cross-talk weight value of 0.5 is produced by estimating the weight based at least on respective areas of the selected non-target nets and respective optic probe intensities at the selected non-target nets. In some implementations of this calculation, the area of the target net is also employed. The cross-talk weight is then applied to the simulated CLA cross-talk waveform 630.

Waveform 650 shows the expected electrical signature of target net 9 provided using SPICE models and pattern simulation of the circuit operation. As can be seen, the extracted target net LP waveform 640 is a much more useful signal for comparison to the expected electrical signature shown in waveform 650 than comparing to raw LP waveform 620. As can be seen, there is a high degree of correlation between the extracted LP waveform, and the waveform produced by the SPICE model, which tends to indicate that there is no defect in the circuitry.

Figure 7:
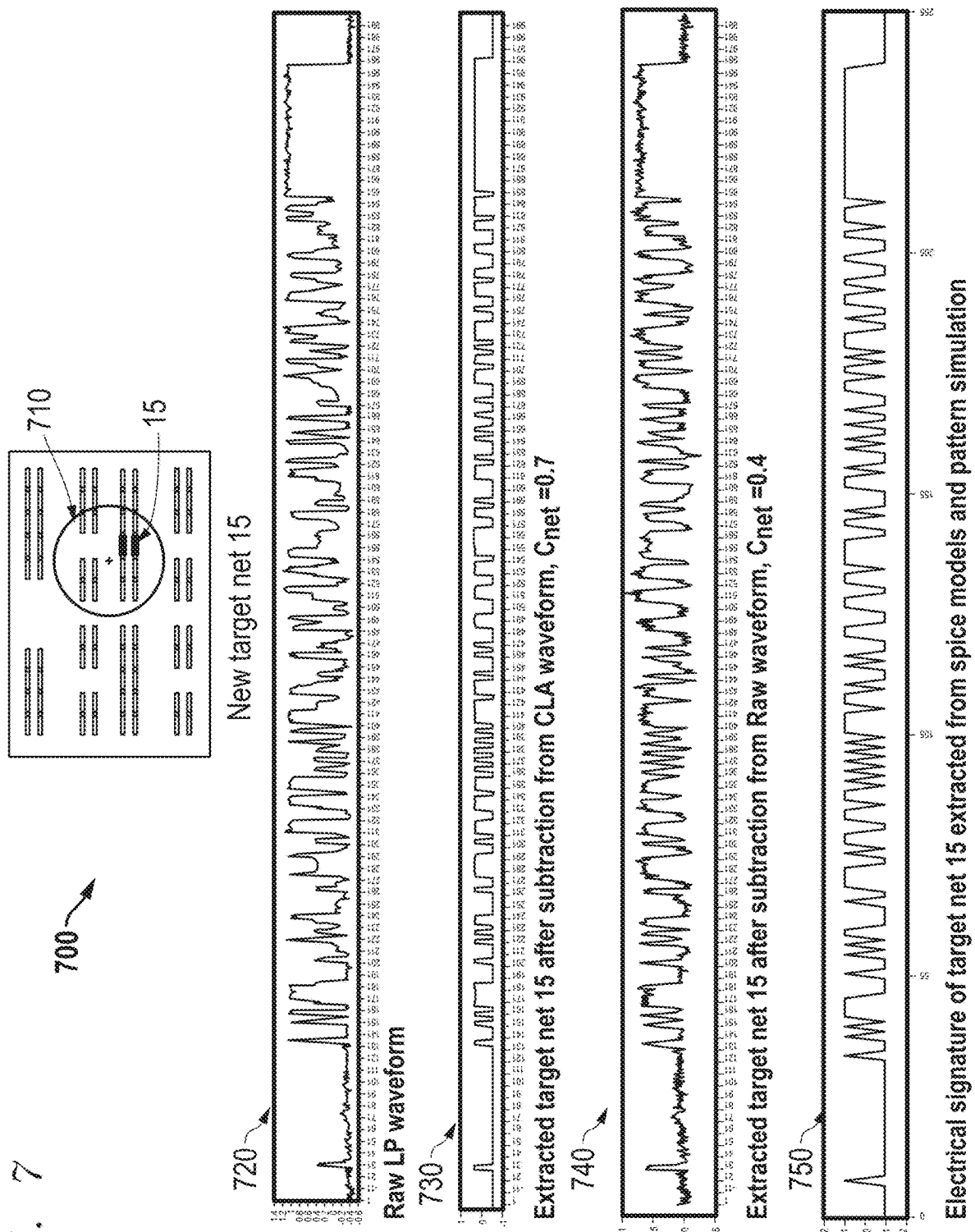
FIG. 7 illustrates a backside view of a portion of an integrated circuit that will be laser probed according to another embodiment, along with four waveforms exemplifying the laser probe analysis.

FIG. 7 illustrates a backside view of a portion of an integrated circuit 700 that will be laser probed according to another embodiment, along with four waveforms exemplifying the laser probe analysis. In this version, the cross-talk weight is estimated using clustering to identify discrete levels through a sweep of cross-talk weight values. Laser probe area 710 is depicted probing an area of integrated circuit 700 including a target net 15 and a number of non-target nets. A raw LP waveform 720 is shown resulting from the probe measurement. A simulated cross-talk CLA waveform (not shown) is produced with target net 15 masked. The cross-talk weight $C_{net}$ is estimated by sweeping through multiple candidate values for $C_{net}$ and analyzing the resulting extracted target net waveforms to find one with clustered values matching an expected clustering of high and low values. The sweep is performed with the simulated CLA waveform or with raw LP waveform 720. An extracted target net waveform 730 shows an example of the sweeping process with a candidate $C_{net}$ value of 0.7 applied to weight the simulated cross-talk CLA waveform and subtract it from a complete CLA waveform. Another extracted target net waveform 740 exemplifies the sweeping process when used with raw LP waveform 720. To produce waveform 740, a candidate value for $C_{net}$ of 0.4 is used to weight the simulated cross-talk CLA waveform and subtract it from raw LP waveform 720. In this example, the sweep results in a cross-talk weight of 0.4 because the clustering of values in waveform 740 most closely matches the clustering in the expected signature of target net 15 shown in waveform 750.

While two techniques are described herein for producing the cross-talk weight, they are not limiting and other embodiments use other techniques to calculate or estimate the cross-talk weight.

Figure 8:
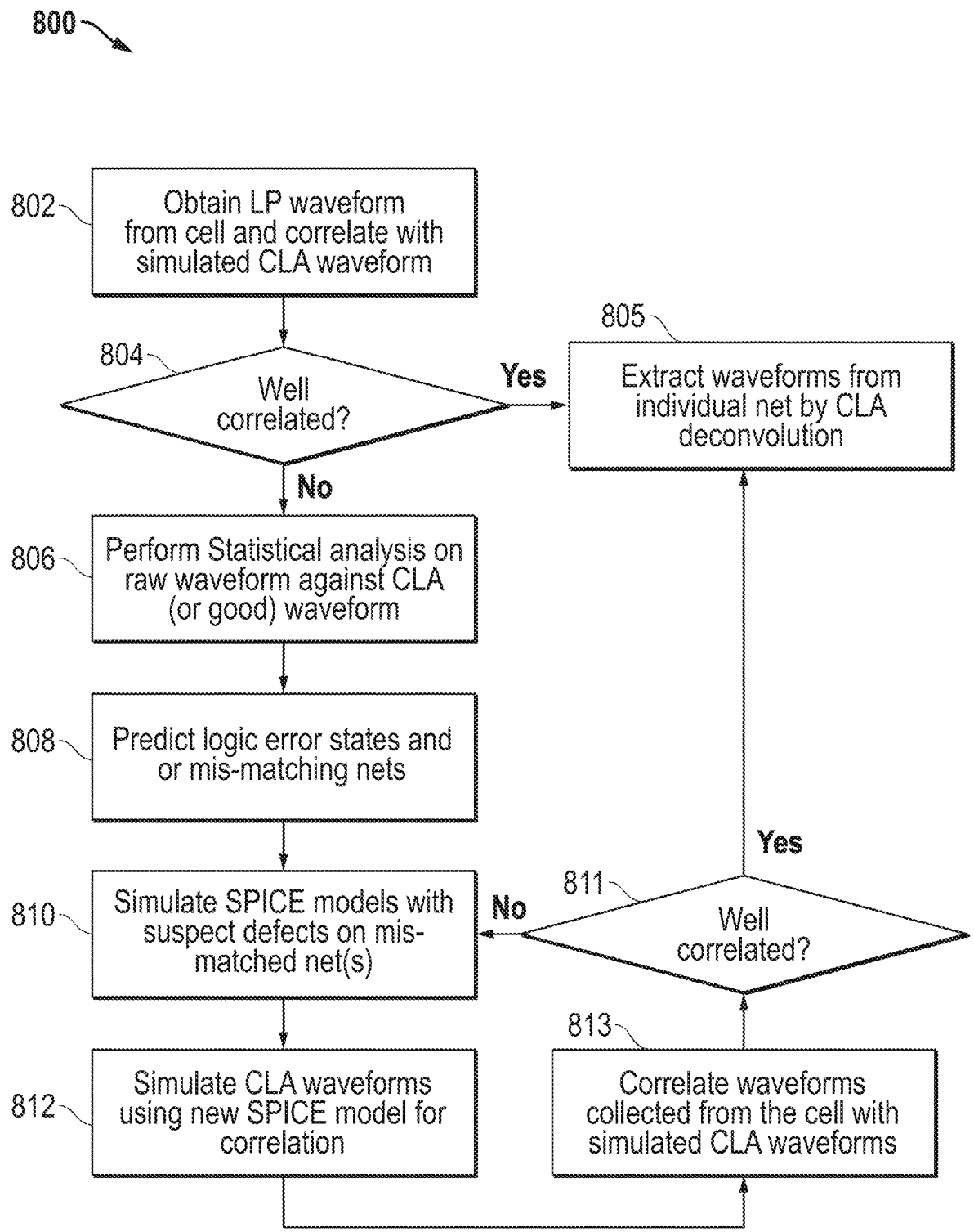
FIG. 8 shows a flow diagram of a laser probe measurement process for use with the laser probing system of FIG. 2 according to some embodiments.

FIG. 8 is a flow diagram 800 of a laser probe measurement process for use with the laser probing system of FIG. 2 according to some embodiments. The depicted process is able to extract accurate information from the laser probe waveforms even though there is optical cross-talk and error states within the nets that are analyzed. The process begins at block 802, where it obtains an LP waveform from a cell in the device under test and performs a correlation analysis of the collected waveform with a simulated CLA waveform. While a correlation is described in this embodiment, in other implementations another suitable degree of fit analysis is used wherever a correlation is discussed herein. The use of a degree of fit analysis while initially positioning the optic probe is described in related U.S. patent application Ser. No. 16/296,614, filed Mar. 8, 2019, entitled "Probe Placement For Laser Probing System." As described in the prior application, in some implementations block 802 includes repositioning the optic probe to improve the degree of fit of measured LP waveforms with simulated CLA waveforms. Generally the degree of fit or level of correlation required to be well-correlated varies in different applications, but a level of at least 85% correlation is used in some embodiments.

The results of the correlation analysis are checked at block 804. If a well-correlated waveform results from the correlation analysis, the process goes to block 805, where it extracts target net waveforms by deconvolution with a cross-talk CLA waveform as described above. If the LP waveform is not well correlated with the simulated CLA waveform, it is likely that one or more error states exist in the cell being measured, and the process at block 804 goes to block 806.

At block 806, the process performs statistical analysis comparing the raw LP waveforms with simulated CLA waveforms by multiple methods including clustering, as further described below. Based on the results of the statistical analysis, block 808 then predicts error states based on which input sequences to the cell cause the most mismatch, and which nets within the cell mismatch the most. Using these predicted error states, block 810 simulates electrical performance of the cell with each of the error states separately, using SPICE models. Block 812 then computes a plurality of error-state CLA waveforms based on the respective electrical simulations. Block 813 then correlates the LP waveform measured from the cell to the error-state CLA waveforms, selecting the error state with an associated error-state CLA waveform having a highest degree of fit to the LP waveform. If a well correlated error-state CLA waveform is found at block 811, the process goes to block 805 where it uses the selected error state in the target net extraction process. If a well correlated error-state CLA waveform is not found at block 811, the process returns to block 810 where further error states are simulated to repeat the comparison process.

Figure 9:
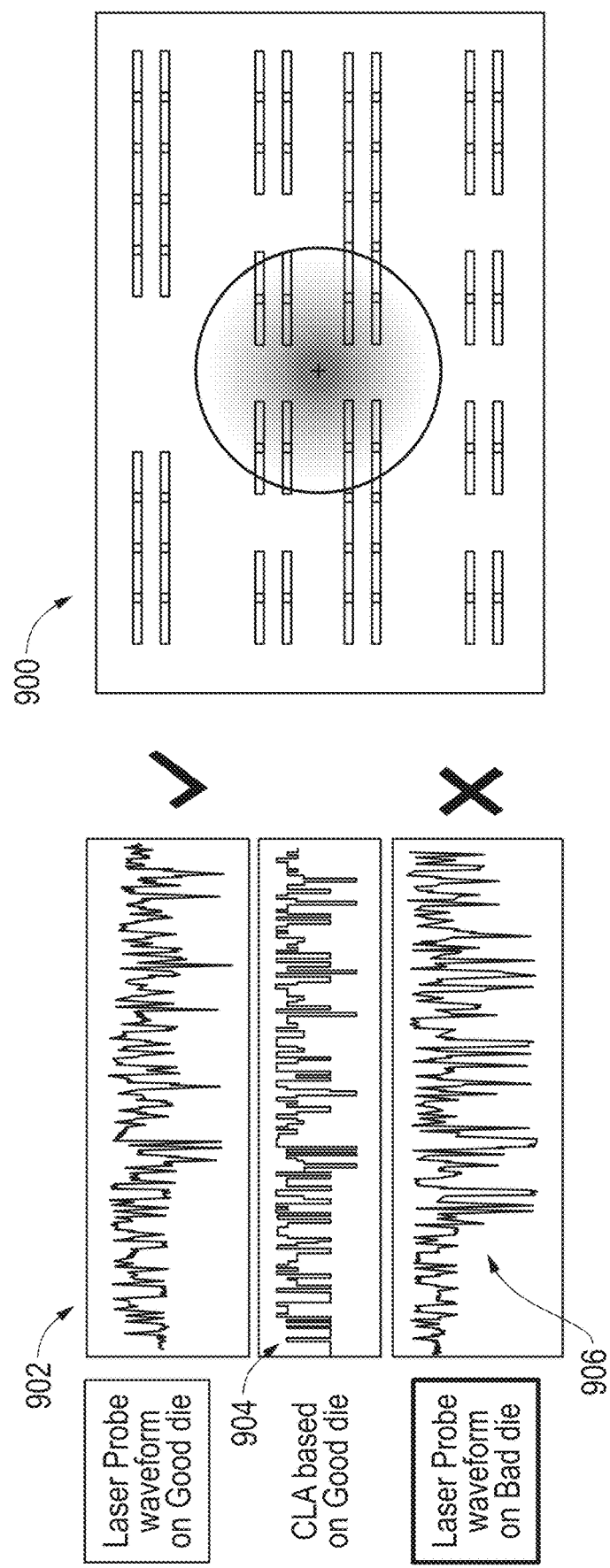
FIG. 9 illustrates a backside view of a portion of an integrated circuit 900 that will be laser probed according to another embodiment, along with three waveforms exemplifying the laser probe analysis.

FIG. 9 illustrates a backside view of a portion of an integrated circuit 900 that will be laser probed according to another embodiment, along with three waveforms exemplifying the laser probe analysis. Waveform 902 illustrates an LP waveform obtained from a good die. Waveform 904 illustrates an example simulated CLA waveform based on a good die. Waveform 906 illustrates an LP waveform obtained from a bad die. In the correlation analysis of blocks 802 and 804 (FIG. 8), waveform 902 correlates highly with waveform 904, while waveform 906 does not correlate highly.

Figure 10:
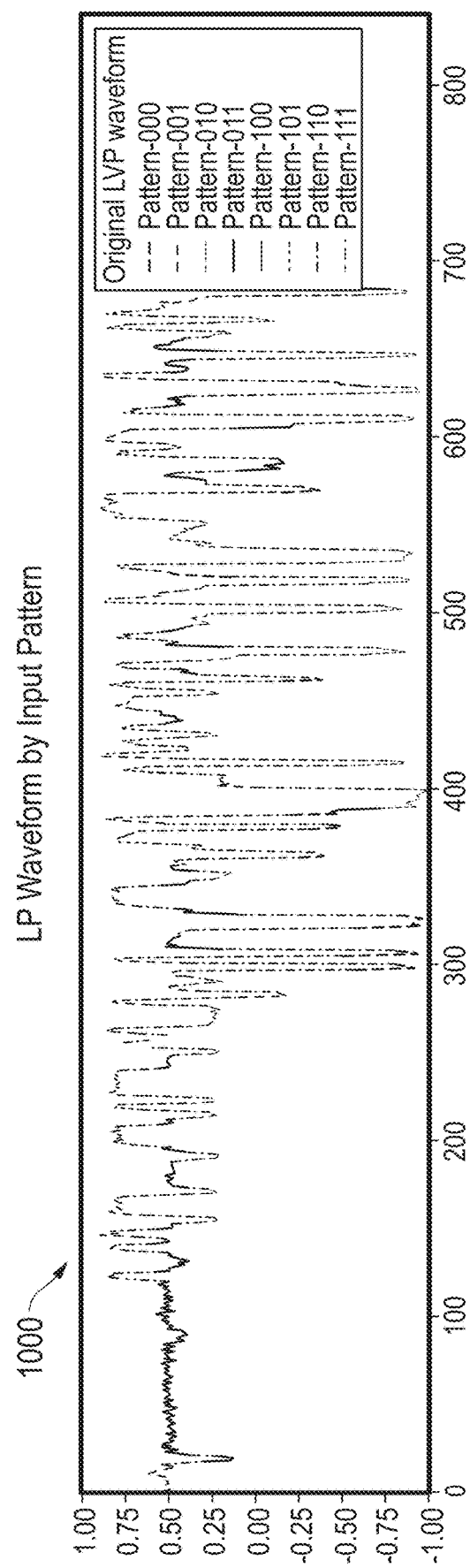
FIG. 10 illustrates a timing diagram of an LP waveform on which a statistical analysis is performed using segmentation according to some embodiments.

FIG. 10 illustrates in chart form an LP waveform 1000 on which a statistical analysis is performed using segmentation according to some embodiments. LP waveform 1000 is measured at a cell of a device under test in response to a test pattern input to the cell. To conduct the segmentation analysis, the test pattern is divided into a number of patterns labelled on the chart legend Pattern-000 through Pattern-111. The LP waveform is segmented accordingly to identify the waveform segments resulting during each segment of the test pattern. The segments resulting from each input pattern are compared or correlated separately to corresponding segments of the simulated CLA waveform, as exemplified by the table of FIG. 11

FIG. 11 shows a table 1100 of partial analytical results from a segmentation analysis like that of FIG. 10. The input values that make up the input pattern are shown in columns A1-A3. The Cycle #column tracks time intervals along the waveform. The Segment #column identifies the segment number that is present in each time interval according to the segments identified in the chart legend of FIG. 10. The Raw-CLA column shows a statistical value computed for each segment, in this example a simple deviation calculation of the raw LP waveform minus the CLA waveform. While a deviation is calculated in this example, many suitable statistical quantities are calculated in different implementations to perform the statistical analysis (block 806, FIG. 8), such as a correlation or other suitable analysis to determine a mismatch between the waveforms. As depicted by the arrow pointing to the entry for Segment #7, a high deviation is found for Segment #7 while the other segments have a low deviation. The statistical analysis therefore determines (block 808) that the cell may be entering an error state for the input pattern of Segment #7. This information this then used to be used to simulate SPICE models with a defect such as a low/high resistance defects on the nets carrying the mismatched signal (block 810). While in this example only one segment has a mismatch, often more than one segment will have a mismatch. The new simulated SPICE models are be used to re-simulate CLA waveforms that can be used for new correlation (block 812). A good match to the new CLA waveform will mean the defect is on the predicted net, the process can proceed to extract waveforms by CLA deconvolution. A bad match means that a new defect should be tried in the SPICE simulation with another related net.

Figure 12:
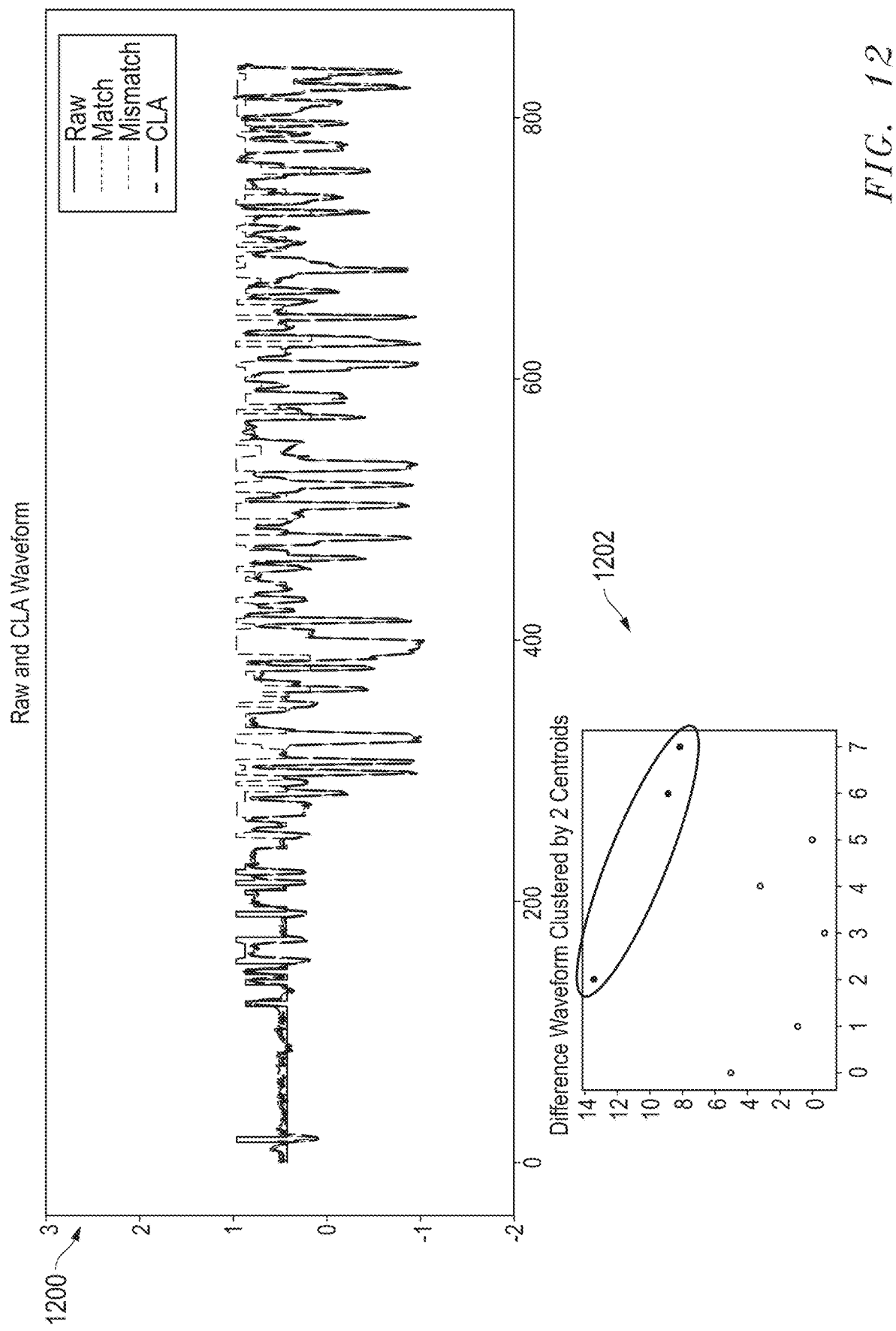
FIG. 12 shows a timing diagram of including LP and CLA waveforms and a corresponding statistical analysis using clustering according to some embodiments.

FIG. 12 shows a chart 1200 including LP and CLA waveforms and a corresponding statistical analysis using clustering according to some embodiments. Chart 1200 shows a simulated CLA waveform overlaid on a raw LP waveform obtained from a cell in a device under test. In the statistical analysis, both waveforms are segmented according to test input values as described above, and compared to determine the segments in which the waveforms match and the segments in which they mismatch. The matching and mismatching segments are identified on the raw LP waveform according to the legend. A difference waveform or value is calculated for each segment, and analyzed according to a clustering analysis as shown in chart 1202, which provides the different values on the vertical axis and segment numbers along the horizontal axis. A cluster 1204 is identified containing three segments that have a high mismatch between the raw LP and CLA waveforms. In this example, clustering analysis is performed using two centroids, however other levels of clustering analysis are used in other implementations. The identified cluster is then mapped onto the test pattern input values to determine error conditions such as one or more individual inputs within the test pattern that may be responsible for the deviation of the cluster. For example, in the depicted analysis, cluster 1204 corresponds to a single primary input value predicting input A2 input is stuck at a value of 0 for the cell being measured. Techniques such as scan diagnostics, cell aware diagnostics, and manual analysis are then employed to determine candidate locations for a failure based on the identified conditions.

Figure 13:
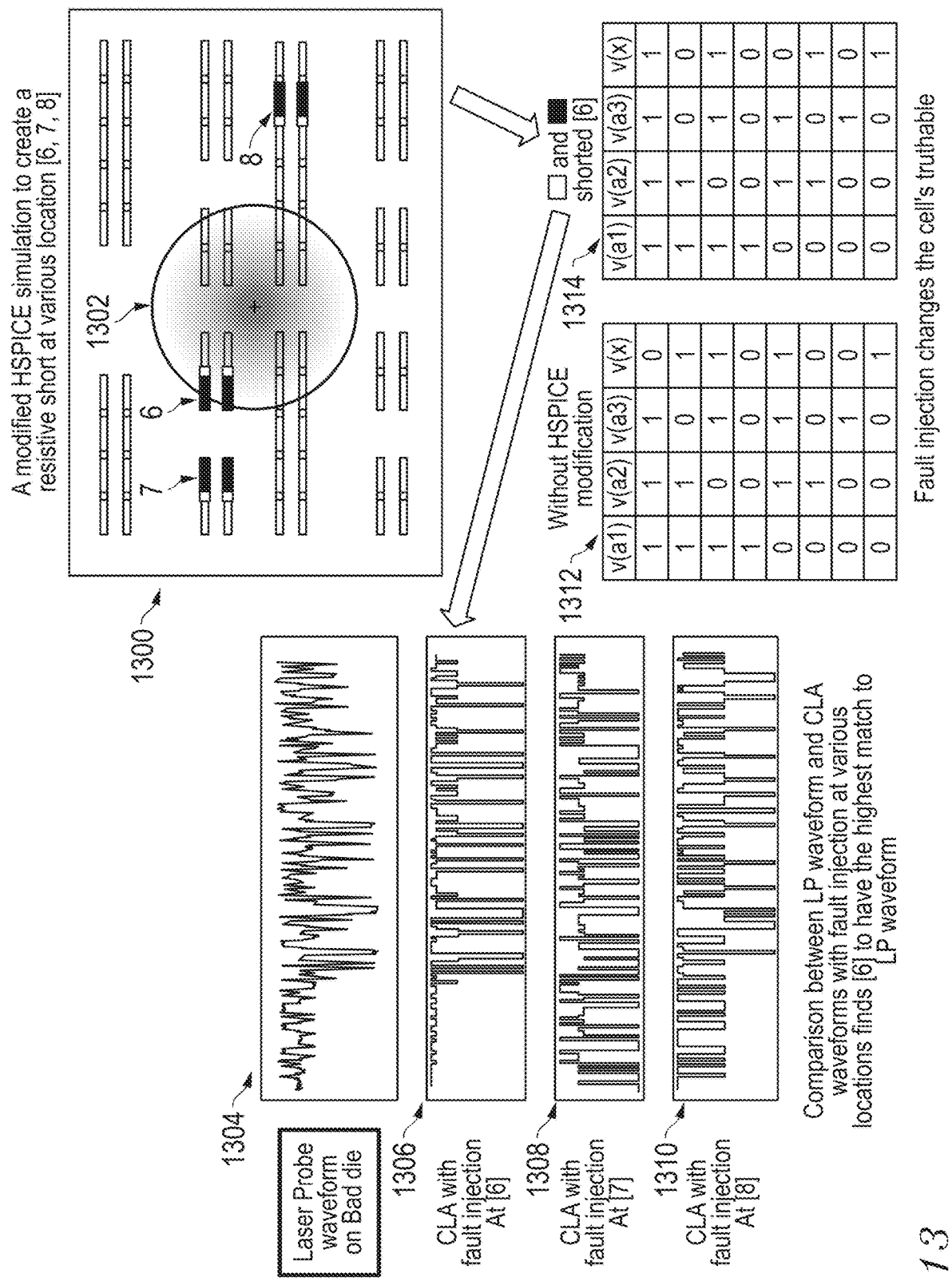
FIG. 13 shows timing diagram and a table of an example process of identifying electrical errors through fault injection and analysis according to some embodiments.

FIG. 13 shows in diagram and table form an example process of identifying electrical errors through fault injection and analysis according to some embodiments. The depicted process is an implementation of blocks 810, 812, 813, and 811 in the process of FIG. 8. The upper-depicted diagram illustrates a backside view of a portion of an integrated circuit 1300 that will be laser probed at location 1302 while applying a test pattern. Locations 6, 7, and 8 within integrated circuit 1300 are candidate locations at which an electrical fault has been predicted to be possible. Device or circuit areas are hatched to illustrate neighboring semiconductor features that may include a fault, such as a gate and drain or gate and source of a transistor.

Waveform 1304 shows an LP waveform obtained by probing location 1302 on a bad semiconductor die (i.e., no high correlation was found at block 804 of FIG. 8). Waveform 1306 shows a simulated CLA waveform obtained by injecting a fault at location 6. Waveforms 1308 and 1310 are simulated CLA waveforms obtained by injecting faults at locations 7 and 8, respectively. The fault injection simulates error states in the cell by introducing electrical faults into an HSPICE electrical simulation at the designated location. The result of the electrical simulation is used to modify the cell's truth table employed in simulating CLA waveforms, as shown by truth table 1312, which depicts a truth table resulting from an unmodified HSPICE simulation, and truth table 1314, which depicts a truth table resulting from inserting an electrical short at location 6. While truth tables 1312 and 1314 show three test pattern inputs v(a1), v(a2), v(a3), and one internal signal v(x), the truth tables employed will often include more inputs and far more internal signals representing the various nets in the cell. Also, while locations 6, 7, and 8 shows potential error states of shorts at transistor devices, typically many types of error state are be predicted and simulated using the techniques herein. For example, short circuits to ground or a supply voltage, short circuits having various impedances, open circuits at various locations, and malfunctioning devices having poor operating conditions such as slow switching, latching up, weak output voltages, and other error states are simulated. Furthermore, while the depicted process involves injecting single faults into the simulation, multiple faults are simulated in other scenarios using the techniques herein.

Analysis of waveforms 1306, 1308, and 1310 shows that waveform 1306 has the high correlation to LP waveform 1304. Therefore, a short at location 6 is determined to be the fault present in the measured integrated circuit 1300. The extraction of target net waveforms from the LP waveform then proceeds by simulating a CLA waveform with the identified fault included, and the desired target net masked as described above with respect to FIG. 5.

Figure 14:
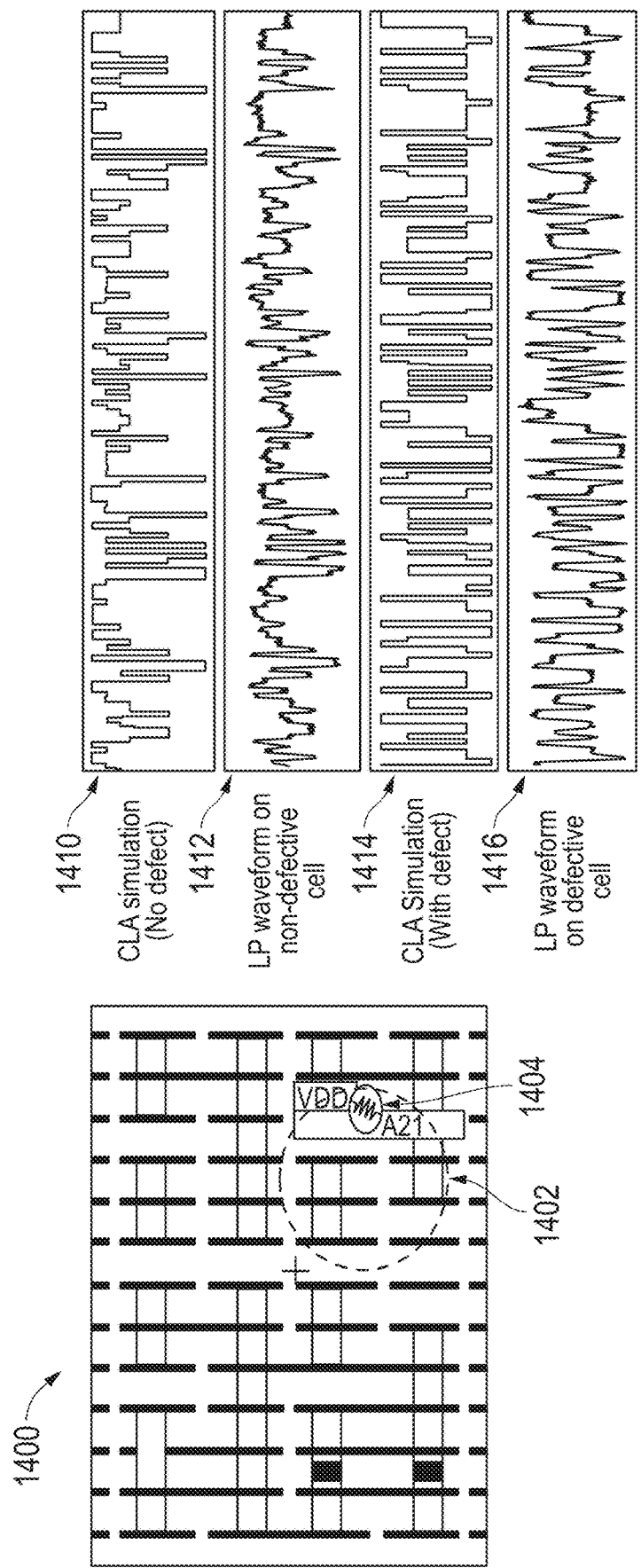
FIG. 14 illustrates in diagram form an example process of simulating an error state within a cell of a semiconductor device according to some embodiments.

FIG. 14 illustrates in diagram form an example process of simulating an error state within a cell 1400 of a semiconductor device according to some embodiments. Cell 1400 includes a number of transistor devices and interconnects, including an interconnect A21 and a supply voltage structure VDD. A low impedance resistor 1404 is added in the HSPICE electrical simulation model (block 810, FIG. 8), to inject a defect of a low impedance short between VDD and interconnect A21. The resulting electrical changes are added to the cell's truth table, and the resistive short is added to the CLA simulation (block 812). The laser probe location 1402 is used in acquiring the LP waveform and in simulating the simulated CLA waveform. A simulated CLA waveform 1410 is shown based on simulating the cell probing without the defect. An LP waveform 1412 is shown obtained from a non-defective cell. A simulated CLA waveform 1414 is shown based on simulating the cell with the defect added. An LP waveform 1416 is shown obtained from a defective cell. As can be seen, simulated CLA waveform 1410 has a high correlation to LP waveform 1412, but a low correlation to LP waveform 1416. However, simulated CLA waveform 1414 has a high correlation to LP waveform 1416. Through correlating waveforms 1414 and 1416, the process identifies the fault in the defective cell, and provides a CLA simulation model that is used to extract target net waveforms at the laser probe location 1402 and other nearby locations in the cell.

The techniques herein provide significant performance improvements in the ability to distinguish target net signals from cross-talk when the target nets measured are smaller than the optic probe resolution. For example, the techniques herein enable extracting a signal measured from the gate of a transistor, the gate having an area of 100 nm2. This feature size is far below the typical resolution of current laser probe techniques. Further advantages are provided in the ability identify error states within a device under test. Still further advantages are provided by allowing for extraction of target net signals from cross-talk signals even in the presence of error states.

Some implementations of the methods illustrated in FIGS. 5 and 8 and the LP software ecosystem illustrated in FIG. 3 are be governed by instructions that are stored in a computer readable storage medium and that are executed by at least one processor. Each of the process blocks shown in FIGS. 5 and 8 and the blocks of the LP ecosystem of FIG. 3 correspond to instructions stored in a non-transitory computer memory or computer readable storage medium. In various embodiments, the non-transitory computer readable storage medium includes a magnetic or optical disk storage device, solid-state storage devices such as Flash memory, or other non-volatile memory device or devices. The computer readable instructions stored on the non-transitory computer readable storage medium, are implemented in source code, assembly language code, object code, or other instruction format that is interpreted and/or executable by one or more processors.

While particular embodiments have been described, various modifications to these embodiments will be apparent to those skilled in the art. For example, the degree of fit between the CLA waveform and the LP waveform can be determined by a variety of statistical measures of the degree of fit. When defects are identified and modeled as described, a library of defects and their associated electrical and simulated CLA behavior is be built in some embodiments, against which LP waveforms are matched to identify electrical faults without repeating the entire fault prediction process for every device tested.

Accordingly, it is intended by the appended claims to cover all modifications of the disclosed embodiments that fall within the scope of the disclosed embodiments.

What is claimed is:

1. A method of performing an optic probe test, comprising:
  positioning an optic probe at a target probe location within a cell of a device under test, the cell including a target net to be measured and a plurality of non-target nets;
  applying a test pattern to the cell with the optic probe at the target probe location and obtaining a laser probe (LP) waveform in response; and
  extracting a target net waveform from the LP waveform by:
    (i) simulating a combinational logic analysis (CLA) cross-talk waveform to model cross-talk from selected non-target nets by simulating an optical response of the cell to said test pattern at the target probe location with the target net masked;
    (ii) estimating a cross-talk weight; and
    (iii) determining a target net waveform by weighting the CLA cross-talk waveform according to the cross-talk weight and subtracting the weighted CLA cross-talk waveform from the LP waveform.

2. The method of claim 1, further comprising:
  predicting an error state related to the cell; and
  when computing the CLA cross-talk waveform, simulating optical response of the cell including the error state.

3. The method of claim 1, further comprising:
  computing a CLA waveform at the target probe location using the test pattern;
  performing statistical analysis on characteristics of the CLA waveform in comparison to the LP waveform;
  based on the statistical analysis, predicting a plurality of error states related to the cell;
  simulating electrical performance of the cell with each of the error states separately, and computing a plurality of error-state CLA waveforms based on the respective simulations;
  selecting the error state with an associated error-state CLA waveform having a highest degree of fit to said LP waveform; and
  when computing the CLA cross-talk waveform, simulating the optical response of the cell including the selected error state.

4. The method of claim 3, wherein the statistical analysis includes segmenting the LP waveform into a plurality of segments resulting from respective input patterns to the cell.

5. The method of claim 4, wherein the statistical analysis includes computing zero-mean waveforms for selected segments of the plurality of segments and computing standard deviations of the zero mean waveforms with respect to corresponding segments of the CLA waveform.

6. The method of claim 4, wherein the statistical analysis includes performing a clustering analysis on at least one characteristic of the segments.

7. The method of claim 1, wherein estimating a cross-talk weight comprises one of: estimating the cross-talk weight by using clustering to identify discrete levels through a sweep of cross-talk weight values, and estimating the cross-talk weight based at least on respective areas of the selected non-target nets and respective optic probe intensities at the selected non-target nets.

8. A laser probing system for laser probing a device under test having a cell, comprising:
  a laser source;
  an optical system adapted to provide an optic probe at selectable locations of the device under test in response to light from said laser source, receive reflected light from the device under test, and output said reflected light;
  a receiver circuit that receives said reflected light from said optical system, and provides a laser probe (LP) waveform in response to said reflected light;
  a combinational logic analysis (CLA) processor that simulates an optical response to a test pattern at a target location of the cell of the device under test and forms a CLA waveform in response; and
  a test controller having a first input for receiving said CLA waveform, a second input for receiving said LP waveform, and an output for providing a control signal, wherein said test controller applies said test pattern to the device under test, triggers said receiver circuit to capture said LP waveform, and causes a target net waveform to be extracted from the LP waveform by: (i) simulating a CLA cross-talk waveform to model cross-talk from selected non-target nets by simulating an optical response of the cell to said test pattern at the target location with the target net masked; (ii) estimating a cross-talk weight; and (iii) determining the target net waveform by weighting the CLA cross-talk waveform according to the cross-talk weight and subtracting the weighted CLA cross-talk waveform from the LP waveform.

9. The laser probing system of claim 8, wherein said test controller predicts an error state related to the cell and causes the CLA cross-talk waveform to be computed by simulating optical response of the cell including the error state.

10. The laser probing system of claim 8, wherein said test controller is further operable to:
  perform statistical analysis on characteristics of the CLA waveform in comparison to the LP waveform;
  based on the statistical analysis, predict a plurality of error states related to the cell;
  simulate electrical performance of the cell with each of the error states separately, and cause the CLA processor to compute a plurality of error-state CLA waveforms based on the respective simulations;
  select one of the error states with an associated error-state CLA waveform having a highest degree of fit to said LP waveform; and
  cause said CLA processor to, when computing the CLA cross-talk waveform, simulate the optical response of the cell including the selected error state.

11. The laser probing system of claim 10, wherein the statistical analysis includes segmenting the LP waveform into a plurality of segments resulting from respective input patterns to the cell.

12. The laser probing system of claim 11, wherein the statistical analysis includes computing zero-mean waveforms for selected segments of the plurality of segments and computing standard deviations of the zero mean waveforms with respect to corresponding segments of the CLA waveform.

13. The laser probing system of claim 11, wherein the statistical analysis includes performing a clustering analysis on at least one characteristic of the segments.

14. The laser probing system of claim 8, wherein:
  the optic probe has a size on a surface of the device under test of 100 nm-300 nm; and the device under test is a semiconductor integrated circuit having transistors whose gate lengths are less than 20 nm.

15. An analysis system for a laser probing system, comprising:
 a receiver circuit having an input for receiving reflected light produced from an optic probe, a control input for receiving a control signal, and an output for providing a laser probe (LP) waveform of said reflected light in response to an activation of said control signal; and
 a combinational logic analysis (CLA) processor having an output for providing a CLA waveform in response to simulating an optical response to a test pattern at a target location on a surface of a cell of a device under test; and
 a test controller having a first input for receiving said CLA waveform, a second input for receiving said LP waveform, a first output for providing said control signal, a second output for providing said test pattern, wherein said test controller applies said test pattern to the device under test, triggers said receiver circuit to capture said LP waveform, and causes a target net waveform to be extracted from the LP waveform by: (i) simulating a CLA cross-talk waveform to model cross-talk from selected non-target nets by simulating an optical response of the cell to said test pattern at the target location with the target net masked; (ii) estimating a cross-talk weight; and (iii) determining the target net waveform by weighting the CLA cross-talk waveform according to the cross-talk weight and subtracting the weighted CLA cross-talk waveform from the LP waveform.

16. The analysis system of claim 15, wherein said test controller predicts an error state related to the cell and causes the CLA cross-talk waveform to be computed by simulating optical response of the cell including the error state.

17. The analysis system of claim 15, wherein said test controller is further operable to:
 perform statistical analysis on characteristics of the CLA waveform in comparison to the LP waveform;
 based on the statistical analysis, predict a plurality of error states related to the cell;
 simulate electrical performance of the cell with each of the error states separately, and cause said CLA processor to compute a plurality of error-state CLA waveforms based on the respective simulations;
 select the error state with an associated error-state CLA waveform having a highest degree of fit to said LP waveform; and
 cause said CLA processor to, when computing the CLA cross-talk waveform, simulate the optical response of the cell including the selected error state.

18. The analysis system of claim 17, wherein the statistical analysis includes segmenting the LP waveform into a plurality of segments resulting from respective input patterns to the cell.

19. The analysis system of claim 18, wherein the statistical analysis includes performing a clustering analysis on at least one characteristic of the segments.

20. The analysis system of claim 15, wherein:
 the optic probe has a size on a surface of the device under test of 100 nm-300 nm; and
 the device under test is a semiconductor integrated circuit having transistors whose gate lengths are less than 20 nm.

* * * * *